United States Patent [19]

Bohg et al.

[11] 4,149,915
[45] Apr. 17, 1979

[54] PROCESS FOR PRODUCING DEFECT-FREE SEMICONDUCTOR DEVICES HAVING OVERLAPPING HIGH CONDUCTIVITY IMPURITY REGIONS

[75] Inventors: Armin Bohg, Neuweiler, Fed. Rep. of Germany; Ingrid E. Magdo, Hopewell Junction, N.Y.

[73] Assignee: International Business Machines Corporation, Armonk, N.Y.

[21] Appl. No.: 872,982

[22] Filed: Jan. 27, 1978

[51] Int. Cl.$^2$ .......................................... H01L 21/223
[52] U.S. Cl. .................................. 148/186; 148/189; 148/1.5
[58] Field of Search ............... 148/186, 187, 188, 189, 148/1.5

[56] References Cited

U.S. PATENT DOCUMENTS

| | | | |
|---|---|---|---|
| 3,491,325 | 1/1970 | Hu | 252/62.3 R |
| 3,770,521 | 11/1973 | Demsky et al. | 148/189 |
| 3,798,084 | 3/1974 | Lyons | 148/186 X |
| 3,834,953 | 9/1974 | Nakamura et al. | 148/186 |
| 3,879,230 | 4/1975 | Nakamura et al. | 148/188 X |
| 3,928,091 | 12/1975 | Tachi et al. | 148/175 |
| 3,966,514 | 6/1976 | Feng et al. | 148/187 |
| 4,049,478 | 9/1977 | Ghosh et al. | 148/187 |

OTHER PUBLICATIONS

Edel et al., "Stress Relief by Counterdoping", *IBM Technical Disclosure Bulletin*, vol. 13, No. 3, Aug. 1970, p. 632.
Edel, "Stacking Fault Free Epitaxial Layers", *IBM Technical Disclosure Bulletin*, vol. 14, No. 5, Oct. 1971, p. 1654.

*Primary Examiner*—G. Ozaki
*Attorney, Agent, or Firm*—Wolmar J. Stoffel

[57] ABSTRACT

A process for fabricating devices having overlapping heavily doped impurity regions of opposite conductivity wherein the formation of crystallographic faults emanating from the overlapping regions is eliminated. It has been discovered that crystallographic faults can be avoided by limiting the total N and P impurity concentrations in the overlapped regions. The process includes forming in the semiconductor substrate a first arsenic doped region having a maximum impurity concentration in the range of $5 \times 10^{20}$ to $3 \times 10^{21}$ atoms/cc, and forming in the silicon substrate a second adjacent boron doped region in partial overlapping relation to the first region having a maximum impurity concentration in the range of $5 \times 10^{19}$ to $3 \times 10^{20}$ atoms/cc.

5 Claims, 7 Drawing Figures

PROCESS FOR PRODUCING DEFECT-FREE SEMICONDUCTOR DEVICES HAVING OVERLAPPING HIGH CONDUCTIVITY IMPURITY REGIONS

BACKGROUND OF THE INVENTION

This invention relates to methods of manufacturing a semiconductor device, more particularly methods which preclude the formation of crystallographic faults in highly microminiaturized integrated circuit semiconductor devices.

In the semiconductor technology higher performance and lower cost per device are achieved by reducing the size of the active and passive semiconductor elements and by reducing the vertical thickness of the portion of the semiconductor wafer which contain the active and passive devices. The cost per device is reduced since many more devices can be fabricated from a single semiconductor wafer using a given sequence of process steps when the devices are made smaller. The total cost of the process steps and materials can then be divided by a larger number of devices. The reduced size of the devices also increases performance since the parasitic capacitive and inductive characteristics are reduced.

As integrated circuit semiconductor device structure becomes more dense, the inadvertent overlapping of opposite type highly doped impurity regions becomes more frequent. An example of a typical device application wherein adjacent highly doped opposite type conductivity regions are likely to overlap is shown in FIG. 1. FIG. 1 illustrates a transistor 10 as described in commonly assigned application SN 150,609, filed June 7, 1971, having an emitter region 12, a base region 14, a subcollector region 16, and a reach through collector contact 18. Transistor 10 is electrically isolated from adjacent elements on the common substrate 20 by a ring of recessed oxide 22 which surrounds the transistor. Beneath oxide 22 is provided a highly doped subisolation region 24 which bridges the distance in the epitaxial layer 21 between the bottom of region 22 and the substrate 20. The P-N junction between the subcollector region 16 and substrate 20 completes the electrical isolation of transistor 10. As the density of the devices gets greater, the probability of regions 16 and 24 overlapping becomes greater. Should regions 16 and 24 overlap, and the regions are heavily doped, it has been observed that crystallographic faults form in the overlapped region which emanate in all directions. These crystallographic faults cause leaks and/or shorts between the various regions of the transistor and also between the transistor and adjacent elements on the semiconductor substrate 20.

SUMMARY OF THE INVENTION

An object of this invention is to provide an improved process for eliminating crystallographic faults produced when highly doped opposite conductivity regions are overlapped.

This process for fabricating overlapping heavily doped impurity regions of opposite conductivity in a silicon substrate which avoids the formation of crystallographic faults originating and emanating from the overlapped regions comprises forming in the silicon substrate a first arsenic region of N-type conductivity having a maximum impurity concentration in the region to be overlapped with an adjacent region that is in the range of $5 \times 10^{20}$ to $3 \times 10^{21}$ atoms/cc, and forming in the silicon substrate a boron second region of P-type conductivity in partial overlapping relation to the first region having a surface impurity concentration in the range of $5 \times 10^{19}$ to $3 \times 10^{20}$ atoms/cc.

DESCRIPTION OF PREFERRED EMBODIMENTS

As discussed previously, highly doped regions of opposite conductivity, when overlapped, produce crystallographic dislocations in the monocrystalline silicon semiconductor body. These crystallographic faults or defects are of major concern in semiconductor fabrication. Impurities can diffuse along the dislocations very rapidly. These diffusions occur during normal fabrication operations of semiconductors which involve heating the device and to a lesser extent during operation of the device. With the dopants lodged in the faults there is produced what is commonly known as a "pipe". Pipes will conduct current and thereby produce a short when they extend between different regions in a device, as for example an emitter and collector. The defects can produce a leaky junction which can materially reduce the effectiveness or operativeness of a transistor, or result in defective isolation. In general crystallographic defects or faults in a device cause it to degrade with time. Thus even if the device with crystallographic defects passes the final test after fabrication, the defects will materially reduce the operating life of the device.

It has been discovered that stresses are created in the crystalline lattice when the combined doping concentration in overlapping impurity regions exceed critical limits. These stresses result in lattice dislocations. It is theorized that in a given silicon region, the presence of a previous dopant enhances the doping level of an opposite dopant. The dopant level of the second opposite impurity, combined with the first dopant level, imposes a severe strain on the crystalline lattice which results in crystallographic faults resulting in pipes, shorts, leaks and degradation of the device. It has been observed that for a $BBr_3$ diffusion in a region of a previous As (arsenic) diffusion having a surface concentration of $3 \times 10^{21}$ atoms/cc, the As diffusion enhances the actual silicon doping with boron by a factor of nearly 4, leading to the observed misfit locations in the overlapped areas.

Figure 1:
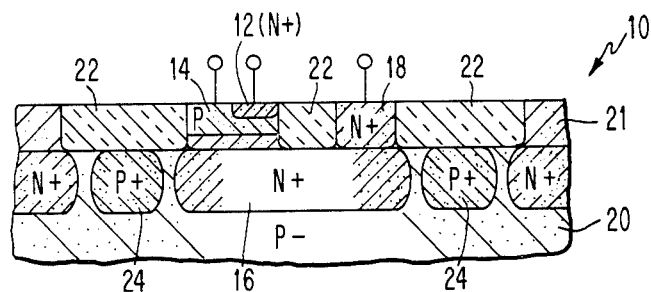
FIG. 1 is an elevational view in broken section illustrating a device configuration known to the prior art.
Figure 2:
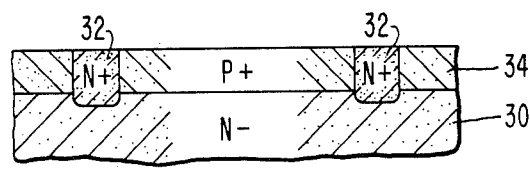
FIG. 2 is an elevational view in broken section illustrating a preferred embodiment of a partially completed device utilizing the methods of the invention.

Referring now to FIG. 2 of the drawings there is depicted a structure which can be produced by the method of this invention which can be used as the base substrate for an integrated circuit device similar to that shown in FIG. 1. In the fabrication of the device shown in FIG. 2 a monocrystalline silicon wafer 30 is oxidized forming a surface layer of $SiO_2$, not shown, which serves as a masking layer. Openings are formed in the masking layer which serve as diffusion windows. An arsenic diffusion is made through the windows resulting in isolation diffusions 32 which when viewed from the top are generally annular in shape. Regions 32 have a maximum dopant concentration in the range of $5\times10^{20}$ to $3\times10^{21}$ atoms/cc. This concentration can be achieved by a capsule diffusion wherein the wafer is placed in a quartz capsule also containing an arsenic vapor source, the capsule sealed, and heated for the time necessary to drive the impurity to the desired depth. The arsenic source is a powdered silicon material which has been exposed to arsenic for a time necessary to produce arsenic at the desired vapor pressure when heated to a suitable temperature. The dopant source is described in detail and claimed in U.S. Pat. No. 3,658,606. After the arsenic diffusion has been made resulting in region 32, the masking oxide layer is removed and a blanket boron diffusion 34 is made from the top surface. The maximum surface concentration in region 34 is $5\times10^{19}$ to $3\times10^{20}$ atoms/cc. This boron concentration can be achieved by a capsule diffusion wherein the wafer is again placed in a quartz capsule along with a vaporizable source of boron, the capsule sealed, and heated for the time necessary to drive the diffusion into the wafer to the desired depth. The source of boron in the capsule can be a powdered silicon source which has also been exposed to vaporized boron similar to that described previously with respect to the arsenic source. As illustrated in FIG. 2 there is an overlap of regions 32 and 34 since region 34 is a blanket diffusion. It has been discovered that if the concentration of the arsenic and boron in the respective regions is maintained within the aforementioned ranges, no crystallographic faults will be formed in the overlapped region. If however, the concentrations are exceeded, crystallographic faults will be formed resulting in the aforedescribed degradation of the device. If the concentrations of the arsenic and boron are below the lower limits of the cited ranges they are not construed as heavily doped. Overlapping of lightly doped regions do not produce crystallographic faults. It has been discovered by the inventors that the aforedescribed limits are critical when the regions are overlapped. Regions 32 and 34 could be formed by other techniques as for example, ion implantation. However, the maximum concentrations of the regions in the overlapped areas must not exceed the aforedescribed ranges for boron and arsenic. The boron could also be diffused by flowing a mixture of $BBr_3$, oxygen, and an inert carrier gas over the heated wafer. This general process is described in U.S. Pat. No. 3,676,231. However, in order to maintain the boron concentration within the aforementioned concentration ranges it is necessary that the temperature of the wafer be maintained at a lower than normal temperature, which lower temperature has been discovered to be in the range of 925° to 970° C. The wafer is maintained at this temperature in the $BBr_3$, oxygen, argon gas mixture in an open tube for approximately 10 minutes. The resultant boron rich glassy layer which forms at the surface is then stripped and the boron already in the wafer is driven in at a temperature in the range of 1000 to 1050° C. for a time of approximately 100 minutes. If the glass is not stripped prior to the drive in the concentration of the boron may exceed the limits prescribed. The resultant strucure shown in FIG. 2 can be used as the basis for an integrated circuit structure similar to that shown in FIG. 1 wherein an epitaxial layer is subsequently grown on the surface, a recess oxide regions formed and the remainder of the transistor structure made in the epitaxial layer as described in SN 150,609. Alternately, the transistors can be formed by junction isolation wherein a diffusion region is made in the epitaxial layer overlying region 32 and the transistor or other active element formed in a region overlying the boron diffused layer 34.

Figure 3A:
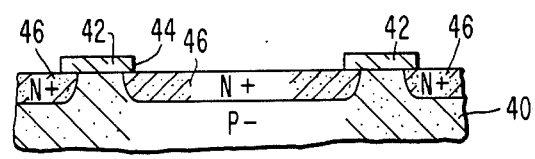
FIGS. 3A, 3B, 3C, 3D, and 3E are a sequence of elevational views in broken section illustrating another preferred specific embodiment of the invention.
Figure 3B:
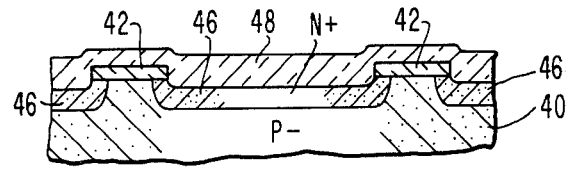
Figure 3C:
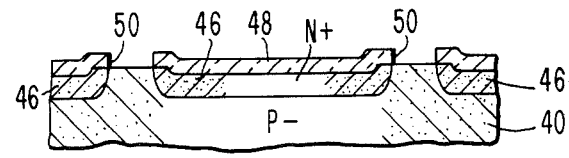
Figure 3D:
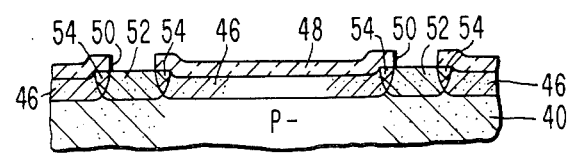

Referring now to FIGS. 3A through 3E there is depicted another preferred specific embodiment of the method of the invention. As illustrated in FIG. 3 the surface of monocrystalline silicon wafer 40 is oxidized forming an $SiO_2$ layer 42. Openings are made in layer 42 for defining the diffusion windows 44. Arsenic is diffused through windows 44 resulting in a heavily doped region 46 suitable for use as the subcollector region of a transistor. The arsenic diffusion 46 can be formed by either a capsule diffusion as described previously or an arsenic implant. Again the maximum surface concentration of the arsenic in a region 46 must be in the range of $5\times10^{20}$ to $3\times10^{21}$ atoms/cc. As illustrated in FIG. 3B the surface of the monocrystalline wafer 40 is then reoxidized forming an $SiO_2$ layer 48. As shown in FIG. 3C windows 50 are formed in layer 48 which serve as diffusion windows for a boron diffused region 52 as shown in FIG. 3B. Regions 52 can be formed by either a capsule diffusion where the capsule is heated to a temperature on the order of 1050° C. for a time typically in the range of 2 to 3 hours, an ion implantation, or an open tube diffusion of a $BBr_3$, oxygen, and argon followed by a drive in after the glassy layer has been removed. All three of these alternative techniques are well known to persons skilled in the art. As shown in FIG. 3C regions 52 and 46 overlap in region 54. When the concentrations of the boron and arsenic have been maintained in the proper ranges the overlapped regions do not result in crystallographic dislocation. A major advantage of this process is that the isolation and subcollector diffusions can be designed to smaller tolerances and overlapped if desired without the risk of the formation of crystallographic defects.

Figure 3E:
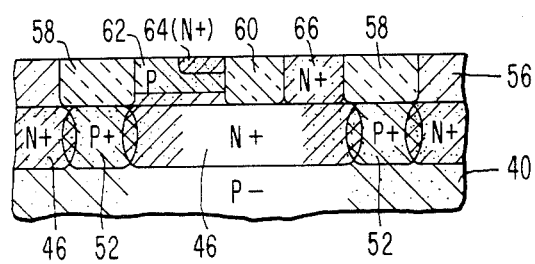

Referring now to FIG. 3E there is disclosed the finished structure of the transistor which can be formed on monocrystalline silicon substrate 40. Oxide layer 48 is removed from the structure shown in FIG. 3D, and an epitaxial silicon layer 56 deposited thereon. The surface of layer 56 is oxidized forming a layer of $SiO_2$, not shown, and a layer of $Si_3N_4$ deposited on the surface by CVD techniques. Openings are made overlying diffused region 52 and also about the ultimate collector reach through contact. A portion of the silicon is then removed, and the silicon oxidized forming recessed oxide regions 58 which overlie isolation regions 52 and thereby complete the isolation of the enclosed transistor. A separate oxidized region 60 separates the collector reach through from the base and emitter of the transistor. This process is disclosed in detail in Sn 150,609. The base region 62 is then diffused from the surface or formed by ion implantation, and the emitter 64 and collector contact 66 formed by either diffusion or ion implantation. It can be seen that a significant advantage can be obtained if the device designer is not required to allow sufficient tolerances between the subcollector and isolation diffusion regions 46 and 52 respectively to assure that the regions do not overlap.

The following examples are included to describe preferred specific embodiments of the method of the invention and are not intended to solely limit the practice of the method.

EXAMPLE 1

A monocrystalline silicon wafer having a background boron doping of $8\times10^{14}$ atoms/cc and a resistivity of 10

Ω cm was placed in a quartz capsule along with an arsenic vapor source and the capsule sealed. The arsenic vapor source consisted of a powdered silicon material in which arsenic had been diffused. The capsule was then heated to a temperature of 1105° C. and maintained at the temperature for 110 minutes. The capsule was opened and the wafer removed. It was determined that the surface concentration of the arsenic was $3 \times 10^{21}$ atoms/cc, the depth was 1.1 microns, and the resistivity at the surface was 6.1 ohms per square. The wafer was then placed in a second quartz capsule along with a boron vapor source and the capsule sealed. The boron vapor source was also a powdered silicon material in which boron had been diffused into the powder. The capsule was heated to a temperature of 1050° C. for 116 minutes. When the capsule was opened the resultant diffusion resulted in a boron concentration of $6.5 \times 10^{19}$ atoms/cc with a depth of 1.1 microns. The resistivity was 56 ohms per square. The boron concentration and depth were determined with a pilot wafer. Since both diffusions were blanket diffusions there was a 100% overlap. Transmission electron microscopy photos were taken of the wafer to determine if any crystallographic faults had been formed. It was determined that no faults had been formed by the complete overlapping of the arsenic and boron diffusions where the impurity concentrations were within the ranges specified in prescribing the practice of the method of the invention.

EXAMPLE 2

A monocrystalline silicon wafer was placed in a capsule with an arsenic vapor source as described in Example 1 and heated to 1105° C. for 110 minutes as described previously in Example 1. Subsequently, the wafer was placed in an open tube diffusion apparatus and a mixture of 1% BBr$_3$, 2% oxygen, and an argon carrier gas emitted to the tube for a period of 10 minutes. The wafer was maintained at a temperature of 950° C. Subsequently, the wafer was removed and the resultant boron rich glassy layer stripped from the surface. The wafer was again placed in the diffusion tube and heated to a temperature of 1000° C. for a time of 100 minutes. During this time argon was flowed over the surface. The resultant concentration of the boron in the region was determined to be $6 \times 10^{19}$ atoms/cc. Transmission electron microscopy techniques indicated that no crystallographic faults were formed in the wafer even though there was 100% overlap of the arsenic and boron diffusions.

EXAMPLE 3

A monocrystalline silicon wafer was placed in a quartz capsule along with an arsenic vapor source and heated as described in Example 1. Subsequently the wafer was placed in a open tube diffusion apparatus and a mixture of BBr$_3$, oxygen, and argon flowed over the wafer which was maintained at a temperature of 1050° C. The flow was discontinued after 10 minutes and the gas changed to oxygen. With the wafer at a temperature of 1000° C., and without removing the resultant boron rich glassy layer, the flow was maintained for 100 minutes which acted as a drive in. The resultant wafer was then examined using transmission electron microscopy techniques and found to have a very high density of dislocations. The maximum boron concentration in the wafer resulting from the boron diffusion was found using a pilot wafer without the As diffusion to be $2 \times 10^{20}$ atoms/cc. This example indicates that crystallographic defects are formed in overlapped regions when the concentration of the boron exceeds the ranges specified for practice of the invention. The critical maximum boron concentration was exceeded during the drive-in when the boron rich glassy layer was not removed. Even though the final boron surface concentration was within the maximum concentration range, having been reduced during the latter part of the drive-in, the dislocations were apparently formed during the initial portion of the drive-in.

While the invention has been particularly shown and described with reference to preferred embodiments thereof it will be understood by those skilled in the art that the foregoing and other changes in form and detail may be made without departing from the spirit and scope of the invention.

What is claimed is:

1. A process for fabricating overlapping heavily doped impurity regions of arsenic and boron in a silicon substrate which avoids the formation of crystallographic faults emanating from the overlapped region comprising:
   forming in the silicon substrate a first region of N-type conductivity having a maximum arsenic concentration in the range of $5 \times 10^{20}$ to $3 \times 10^{21}$ atoms/cc,
   forming in the silicon substrate a second adjacent region of P-type conductivity in partial overlapping relation to said first region having maximum boron concentration in the range of $5 \times 10^{19}$ to $3 \times 10^{20}$ atoms/cc.

2. The process of claim 1 wherein said second region is formed by masking said silicon substrate to define a diffusion window for said second region, placing the substrate in a capsule containing a vapor source of boron, sealing the capsule, heating the capsule to vaporize said source of boron, and continuing to heat said capsule until the boron has diffused into the silicon substrate to the desired depth and attains the desired sheet resistivity.

3. The process of claim 2 wherein said capsule is heated to a temperature on the order of 1050° C. for a time in the range of 2 to 3 hours.

4. The process as in claim 1 wherein said second region is formed by masking said silicon substrate to define the diffusion window for said second region, heating the silicon substrate to a temperature in the range of 925° to 970° C., flowing a gaseous mixture of (1) BBr$_3$, (2) O$_2$ and (3) an inert carrier gas, thereby forming a glassy boron rich layer on the surface of the silicon substrate, removing the glassy layer, and heating the silicon substrate to a temperature in the range of 1,000°–1,050° C.

5. The process of claim 4 wherein said first region is formed by masking said silicon substrate to define the diffusion window of said first region, placing the silicon substrate in a capsule containing a vapor source of arsenic, sealing the capsule, heating the capsule to vaporize the vapor source of arsenic, and continuing to heat the capsule until the arsenic has diffused into the silicon substrate to the desired depth.

* * * * *